United States Patent [19]
Protigal et al.

[11] Patent Number: 5,687,109
[45] Date of Patent: *Nov. 11, 1997

[54] INTEGRATED CIRCUIT MODULE HAVING ON-CHIP SURGE CAPACITORS

[75] Inventors: Stanley N. Protigal; Wen-Foo Chern; Ward D. Parkinson; Leland R. Nevill; Gary M. Johnson; Thomas M. Trent; Kevin G. Duesman, all of Boise, Id.

[73] Assignee: Micron Technology, Inc., Boise, Id.

[*] Notice: The term of this patent shall not extend beyond the expiration date of Pat. No. 5,307,309.

[21] Appl. No.: 671,248

[22] Filed: Jun. 27, 1996

Related U.S. Application Data

[63] Continuation of Ser. No. 178,716, Jan. 10, 1994, which is a continuation of Ser. No. 34,001, Mar. 19, 1993, Pat. No. 5,307,309, which is a continuation of Ser. No. 774,121, Oct. 8, 1991, abandoned, which is a continuation of Ser. No. 291,294, Dec. 27, 1988, abandoned, which is a continuation-in-part of Ser. No. 200,673, May 31, 1988, abandoned.

[51] Int. Cl.$^6$ .................................................. G11C 5/06
[52] U.S. Cl. ................... 365/63; 365/51; 365/52; 365/149; 257/312; 257/532
[58] Field of Search ............................. 365/63, 51, 52, 365/149; 257/312, 532

[56] References Cited

U.S. PATENT DOCUMENTS

| | | |
|---|---|---|
| 3,460,010 | 8/1969 | Domenico et al. |
| 3,538,397 | 11/1970 | Davis . |
| 3,769,105 | 10/1973 | Chen et al. |
| 3,772,097 | 11/1973 | Davis . |
| 4,164,751 | 8/1979 | Tasch, Jr. |
| 4,266,282 | 5/1981 | Henle et al. |
| 4,317,686 | 3/1982 | Anand et al. |
| 4,349,862 | 9/1982 | Bajorek et al. |
| 4,423,431 | 12/1983 | Sasaki . |
| 4,427,989 | 1/1984 | Anantha et al. |
| 4,477,736 | 10/1984 | Onishi . |
| 4,493,056 | 1/1985 | Mao . |
| 4,567,542 | 1/1986 | Shimada et al. |
| 4,577,214 | 3/1986 | Schaper . |
| 4,604,639 | 8/1986 | Kinoshita . |
| 4,605,980 | 8/1986 | Hartranft et al. |
| 4,641,425 | 2/1987 | Dubuisson et al. |
| 4,654,690 | 3/1987 | Okada et al. |
| 4,656,605 | 4/1987 | Clayton . |
| 4,691,304 | 9/1987 | Hori et al. |
| 4,720,737 | 1/1988 | Shirato . |
| 4,737,830 | 4/1988 | Patel et al. |
| 4,777,518 | 10/1988 | Mihara et al. |
| 4,780,846 | 10/1988 | Tanabe et al. |
| 4,835,416 | 5/1989 | Miller . |
| 4,937,649 | 6/1990 | Shiba et al. |
| 5,032,892 | 7/1991 | Chern et al. |
| 5,266,821 | 11/1993 | Chern et al. |
| 5,307,309 | 4/1994 | Protigal et al. |

FOREIGN PATENT DOCUMENTS

| | | |
|---|---|---|
| 56-15065 | 2/1981 | Japan . |
| 58-64048 | 4/1983 | Japan . |
| 58-77251 | 5/1983 | Japan . |
| 61-73367 | 4/1986 | Japan . |

Primary Examiner—Son T. Dinh
Attorney, Agent, or Firm—Trask, Britt & Rossa

[57] ABSTRACT

A SIMM (single in-line memory module) board is provided with a plurality of integrated semiconductor memory or other integrated semiconductor circuit devices which include, as a part of each integrated circuit device, a current spike leveling capacitor. The capacitor is on the die side of circuitry connecting the device to the board. By connecting the on-chip capacitors of the integrated circuit devices in parallel, sufficient capacitance is provided to stabilize current to all of the integrated circuit devices.

39 Claims, 7 Drawing Sheets

INTEGRATED CIRCUIT MODULE HAVING ON-CHIP SURGE CAPACITORS

CROSS REFERENCE TO RELATED APPLICATIONS

This is a continuation of U.S. patent application Ser. No. 08/178,716 filed on Jan. 10, 1994, now pending, which is a continuation of U.S. patent application Ser. No. 08/054,001, filed on Mar. 14, 1993, now U.S. Pat. No. 5,307,309, which is a continuation of U.S. application Ser. No. 07/774,121, filed on Oct. 08, 1991, now abandoned, which is a continuation of U.S. application Ser. No. 07/291,294, filed on Dec. 27, 1988, now abandoned, which is a continuation in part of U.S. application Ser. No. 07/200,673, filed on May 31, 1988; now abandoned.

FIELD OF THE INVENTION

This invention relates to arrays of semiconductor circuit devices, in which a plurality of integrated circuit chips are mounted to a printed circuit board or the like for connection to a main circuit board (mother board). The invention is directed to power supply filtering of SIMM (single in-line memory module) arrays, and similar arrays.

This invention further relates to semiconductor devices, and more specifically to circuit connections on semiconductor devices and to the reduction of voltage transients on the semiconductor devices.

BACKGROUND OF THE INVENTION

Integrated semiconductor devices are typically constructed en masse on a wafer of silicon or gallium arsenide. Each device generally takes the form of an integrated circuit (IC) die, which is attached to a lead frame with gold wires. As shown in FIG. 1, the die and lead frame are then encapsulated in a plastic or ceramic package, which is then recognizable as an IC "chip". IC chips come in a variety of forms such as dynamic random access memory (DRAM) chips, static random access memory (SRAM) chips, read only memory (ROM) chips, gate arrays, and so forth. The chips are interconnected in myriad combinations on printed circuit boards by a number of techniques, such as socketing and soldering.

Interconnections among chips arrayed on printed circuit boards are typically made by conductive traces formed by photolithography and etching processes. Semiconductor circuit devices, including DRAMs, SRAMs and gate arrays are essentially switching devices. As the output drivers within those chips create intermittent current flow on associated conductive traces, the traces behave as inductors, creating voltage surges which have the potential for creating logic errors. Other logic-damaging transient voltages, caused by voltage fluctuations at the power line and the interaction of other circuit components in the system, may also be present.

In order to render innocuous the transient voltages which regularly appear in logic circuits, decoupling capacitors are commonly used as low-frequency bypass filters.

The gold connection wires, because of their length relative to their diameter, function as inductors. As current through the gold connection wires is alternately switched on and off, voltage spikes occur. In order to reduce the effects of voltage transients, external capacitors have been installed either within the semiconductor package or on a circuit board onto which the semiconductor packages are installed. In either case, the capacitor is on an opposite side of the lead frame connection wire from the semiconductor die. This establishes the circuit shown in FIG. 2. This equivalent circuit represents an inappropriate arrangement for filtering voltage transients which would affect active circuit 11.

One circuit-board-mounted semiconductor chip array that is of particular interest is the SIMM (single in-line memory module). SIMM boards are typically constructed with such capacitors, which are usually located beneath or adjacent memory array circuit chips on the SIMM.

SIMM (single in line memory module) boards are circuit arrays which consist of byte multiples of memory chips arranged on a printed circuit board or comparable mounting arrangement. The SIMM board is connected to a circuit control board by an edge connector.

The SIMM is a highly space-efficient memory board having no on board address circuitry and which is designed to plug directly into the address, data and power-supply buses of a computer so that the randomly-addressable memory cells of the SIMM can be addressed directly by the computer's CPU rather than by a bank-switching technique commonly used in larger memory expansion boards. Memory cells on the SIMM are perceived by the computer's CPU as being no different than memory cells found on the computer's mother board. Since SIMMs are typically populated with byte multiples of DRAMs, for any eight bit byte or sixteen bit byte or word of information stored within a SIMM, each of the component bits will be found on a separate chip and will be individually addressable by column and row. One edge of a SIMM module is a card-edge connector, which plugs into a socket on the computer which is directly connected to the computer buses required for powering and addressing the memory on the SIMM.

The control board may be any of a number of circuits which address memory arrays. Examples include computer mother boards, daughter boards which plug into a mother board, wherein the daughter board functions as a mother board for the SIMM module, peripheral devices with a capability of using add-on memory, and special purpose equipment which uses memory. It is also possible to use small modules of arrays of similar circuits for purposes other than memory applications.

The capacitor on the SIMM, mounted external to the memory chips, establishes an inappropriate arrangement for filtering voltage transients. Therefore, it is desirable to provide capacitance on the other side of the inductor, i.e., the side of the inductor that the device is connected to.

Present SIMM boards are provided with surface-mounted decoupling capacitors, which cannot be seen in plan view. In the usual case, one decoupling capacitor is mounted beneath each DRAM chip, between bus voltage ($V_{CC}$) input and the connection ground. The $V_{CC}$ bus and the ground-plane bus D circuit board are not visible in a plan via since those particular bus traces are located between two of the board's six layers.

In most cases, each of the module's decoupling capacitors are connected in parallel between the $V_{CC}$ bus and the ground plane bus. As long as the dielectric of each of the eight capacitors is intact, the module is functional. However, a short in any one of the eight capacitors will result in the $V_{CC}$ bus becoming shorted to the ground-plane bus, whereupon the module will begin to draw an inordinate amount of current which will invariably result in its destruction.

Decoupling capacitors of the surface-mount type are particularly susceptible to shorting, since they have no leads to thermally isolate them as they are soldered to a circuit board with infrared energy, at temperatures of up to 400° C. (700° F.). Even if a surface-mount capacitor survives the mechanical shock generated by the soldering process, it is still vulnerable to other types of mechanical stress. For example, by simply bending a SIMM having surface-mounted capacitors, the capacitors may be compromised. And, even if a SIMM passes testing (an indication that the decoupling capacitors are at least not shorted), it may have a relatively high failure rate when placed in use. SIMMs of the type shown in FIG. 9 have an unacceptable average failure rate traceable to shorted decoupling capacitors during the first 90 days of use of roughly 3–10 per 100,000.

Single in-line packages (SIPs) are similar in design to SIMMs, except that instead of having a card edge-type connector, SIPs have pins which are either socketed or soldered for connection to a bus. The problems associated with the decoupling capacitor system of SIMMs also apply to SIPs.

Most semiconductors, including all DRAMS, include capacitors. For example, a 4 megabit DRAM includes over 4 million capacitors each. For the purpose of storing individual bits of information, these capacitors are accessed by connections through access transistors and sense amplifiers, connected through a peripheral circuit. The present invention concerns adding filter capacitance to such devices in order to provide protection from voltage transients which may not be afforded by what may be millions of other capacitors on the semiconductor device.

Semiconductor circuit devices are designed with an architecture which places their functional circuitry within a confined area, usually rectangularly shaped. At the perimeter (either outside or inside) of the rectangularly shaped area are a series of contact pads and a substantial amount of chip area which is occupied by conductor buses, but is unoccupied by active circuit devices. Unlike many of the circuit elements on a semiconductor circuit device, filter capacitors need not be built to precise specifications. It is therefore, possible to utilize perimeter areas and portions of semiconductor chip area which form major border areas between active portions of the semiconductor circuit device.

There is a significant advantage in providing that any added circuit elements be on the same side of a chip wafer as other circuit elements, because of manufacturing techniques and tolerances. Conventionally, semiconductor circuit devices are arrayed on one side of a die wafer. It would therefore be advantageous to design a filtering element which would not significantly expand the die area (chip area) required for each die.

There is a certain portion of the die area which is not particularly suitable for active circuitry. This includes chip area occupied by bus lines, which are normally metallization which overlays most or all of the patterned layers which make up the active circuitry on the die.

SUMMARY OF THE INVENTION

In accordance with the present invention, capacitance filtering is provided for a circuit having an array of similar semiconductor circuit devices, such as a SIMM (single in-line memory module) array of semiconductor circuit devices. The semiconductor circuit devices are formed with capacitors located primarily in border areas, including perimeter border areas and intermediate border areas.

BRIEF DESCRIPTION OF THE DRAWINGS

FIG. 9 shows a SIMM module constructed in accordance with the present invention.

DETAILED DESCRIPTION OF THE PREFERRED EMBODIMENTS

Figure 1:
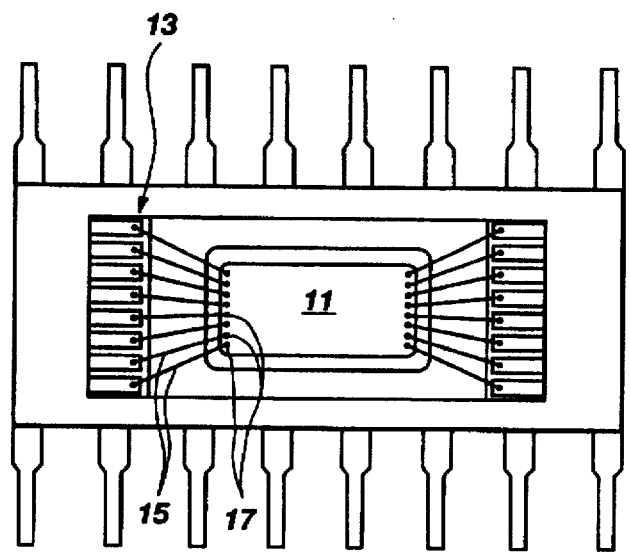
FIG. 1 shows a top view of a semiconductor device attached by pads to the lead frame.
Figure 2:
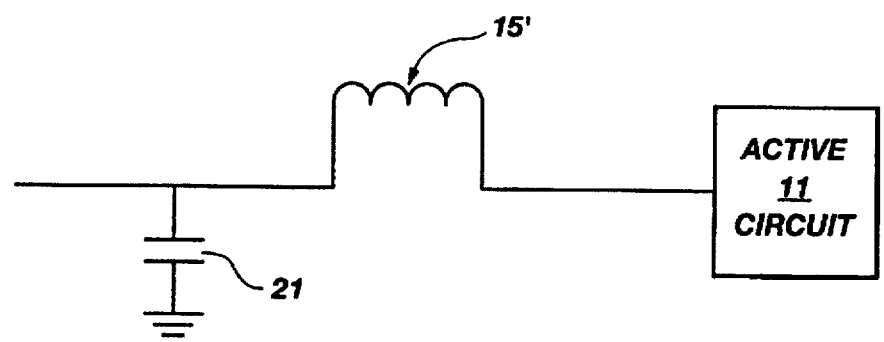
FIG. 2 shows an equivalent circuit of a semiconductor device connected to a lead wire and an off-chip capacitor.
Figure 3:
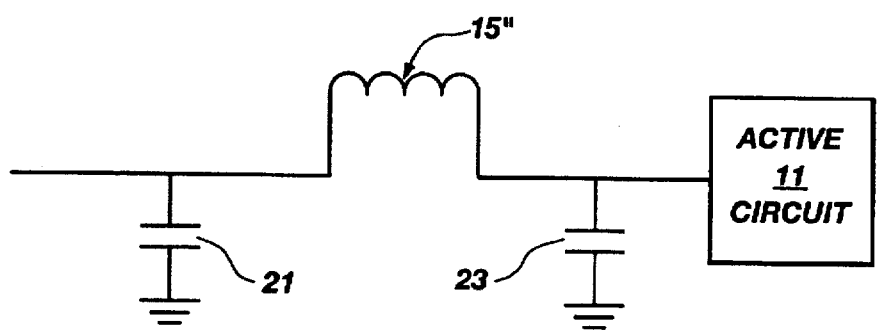
FIG. 3 shows an equivalent circuit of a semiconductor circuit device connected through a lead frame connection wire and having an on-chip decoupling capacitor.

Referring to FIG. 1, a semiconductor device includes a die 11 which is connected to a leadframe 13 by a plurality of lead wires 15. The lead wires 15 are attached to the die 11 at pads or contact points 17. The lead wires 15 function as inductors 15' and 15" as schematically shown in FIGS. 2 and 3. While an external capacitor 21 is often provided, an appropriate filter capacitance would be located on the die side of the lead wire 15", as schematically shown in FIG. 3, at 23.

Figure 4:
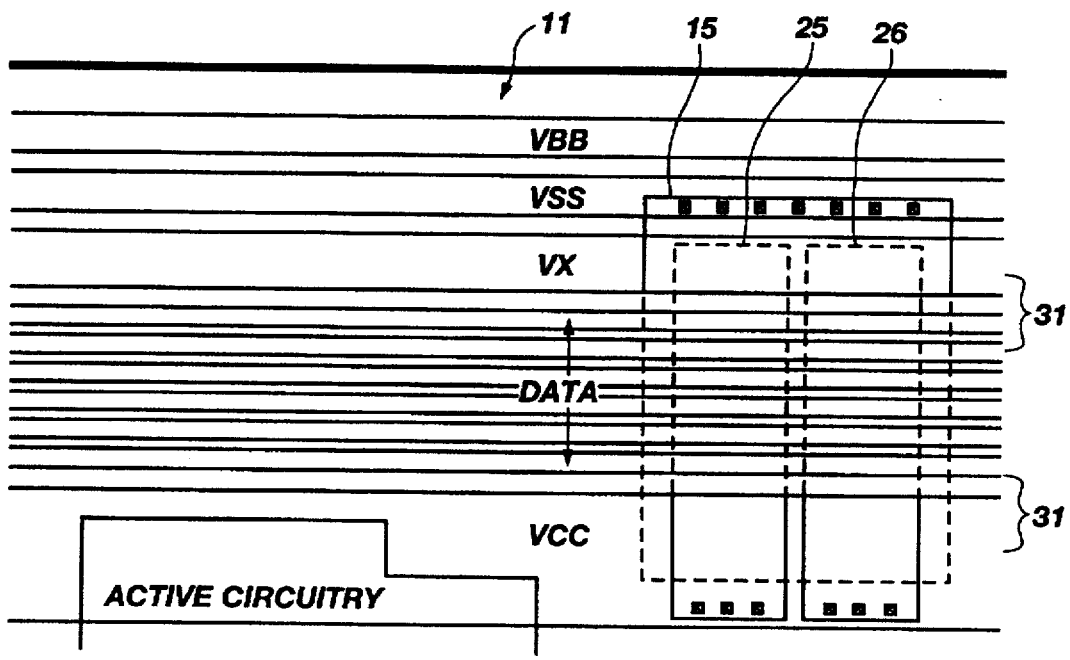
FIG. 4 shows a top view of a semiconductor, which incorporates a decoupling capacitor.

FIG. 4 shows details of one end of the die 11 constructed with the present invention, a pair of capacitors are defined by an active area of the substrate 30 and a polysilicon (poly) layer which is formed into strips 25, 26. The active area 30 is in electrical communication with a first bus line $V_{SS}$. The poly strips 25, 26 are in electrical communication with a second bus line $V_{CC}$. Oxide is used to separate the poly 25, 26 from the active area 30.

The capacitors defined by the strips 25, 26 are on a location of the circuit die 11 which underlies VX and $V_{CC}$, as well as other buses 31. The buses 31 (including VX and $V_{CC}$) are typically metallization layers, and real estate occupied by the buses 31 cannot be used for most types of active circuitry. This is because active circuitry requires utilization of layers as outputs, which in this case is prevented by the buses 31 which are uses for routing signals from the left end to the right end of the chip.

Figure 5:
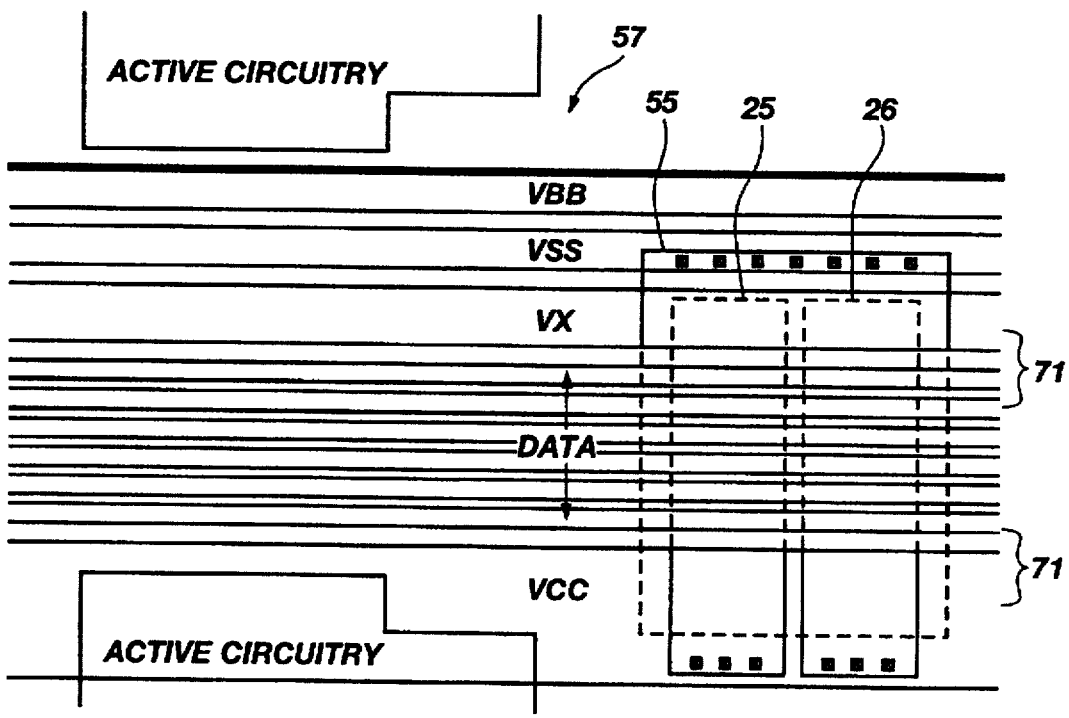
FIG. 5 shows a top view of a semiconductor device, in which a decoupling capacitor is placed along an intermediate boundary area of the chip architecture.

FIG. 5 shows a configuration in which a pair of capacitors are defined by an active substrate area 55 along an intermediate portion of a semiconductor die 57. A plurality of poly strips 25–26, superimposed over the active poly area define a plurality of capacitors. Circuit buses 71 are superimposed over the capacitors formed by the poly strips, so that the capacitors do not occupy real estate that could be used for most active circuit devices.

The invention has been described in terms of connection to circuit buses which have external connections. It is possible that an additional circuit may be placed between the bus and an external connection. A likely example of such an additional circuit would a voltage regulating circuit. It is possible to connect the capacitor to a bus which extends between such an additional circuit and a main portion of the integrated circuit device.

Figure 6:
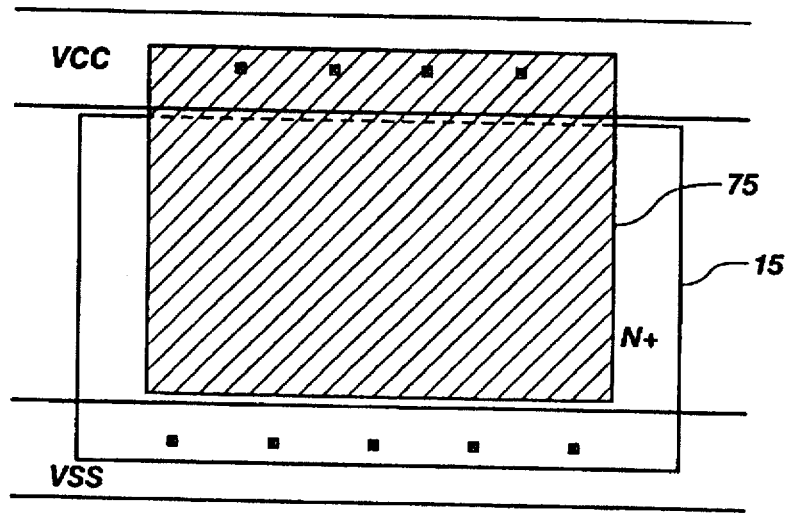
FIGS. 6 and 7 show connection arrangements for N-channel and P-channel capacitors, respectively.
Figure 7:
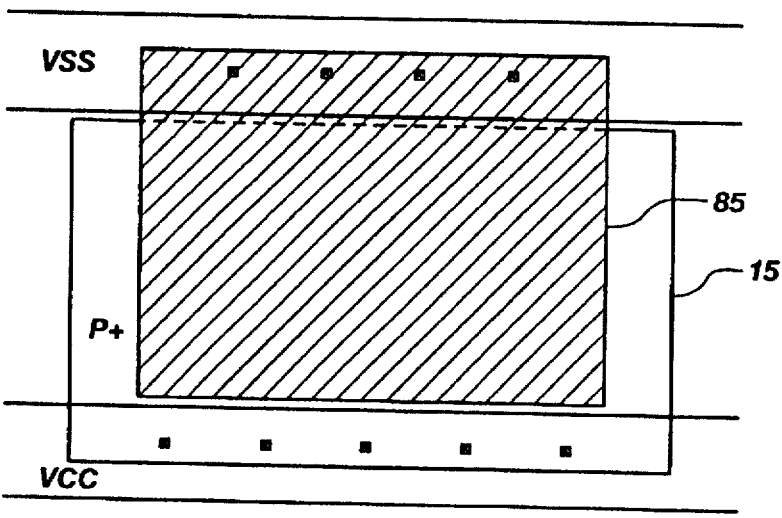

The present embodiment contemplates the use of N channel capacitors, with $V_{SS}$ connected to active area 30' and $V_{CC}$ connected to poly 75. This is shown in FIG. 6. It is possible to construct P channel capacitors, with $V_{CC}$ connected to active area 30 " and $V_{SS}$ connected to poly 85. This is shown in FIG. 7. Each of these is an enhancement mode capacitor, which has a preferential voltage polarity. It is also possible to form these capacitors as depletion mode capacitors.

Figure 8:
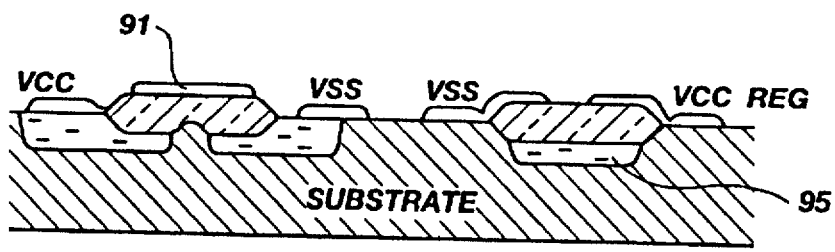
FIG. 8 shows a-cross-sectional view of an arrangement in which two capacitors are connected in series in order to increase breakdown voltage.

It may also be the case that two capacitors may be connected in series in order to increase the total breakdown voltage of the combined capacitors. Enhancement mode capacitors require adjustment for their preferential voltage polarity. This can be accomplished through interconnects or similar means. Depletion mode capacitors, on the other hand, have less preferential voltage polarity. If the capacitors are not polarization sensitive, then the capacitors can have a common poly plate 91 or a common active area 95, as schematically shown in FIG. 8.

FIG. 9 shows a SIMM (single in-line memory module) board 101, which consists of a printed circuit board 103, on which are mounted a plurality of semiconductor memory devices such as DRAMs 105. The printed circuit board 103 includes an edge connector 107, which extends from the printed circuit board 103 in order to permit the card 101 to be plugged into a computer bus (not shown) on a computer. The computer bus has a capability of addressing the DRAMs 105 on the board, in a predetermined sequence as defined by the SIMM protocol. Typically, an entire row of DRAMs 105 are simultaneously addressed to obtain a byte of information. Other addressing schemes are, of course, possible.

Figure 10:
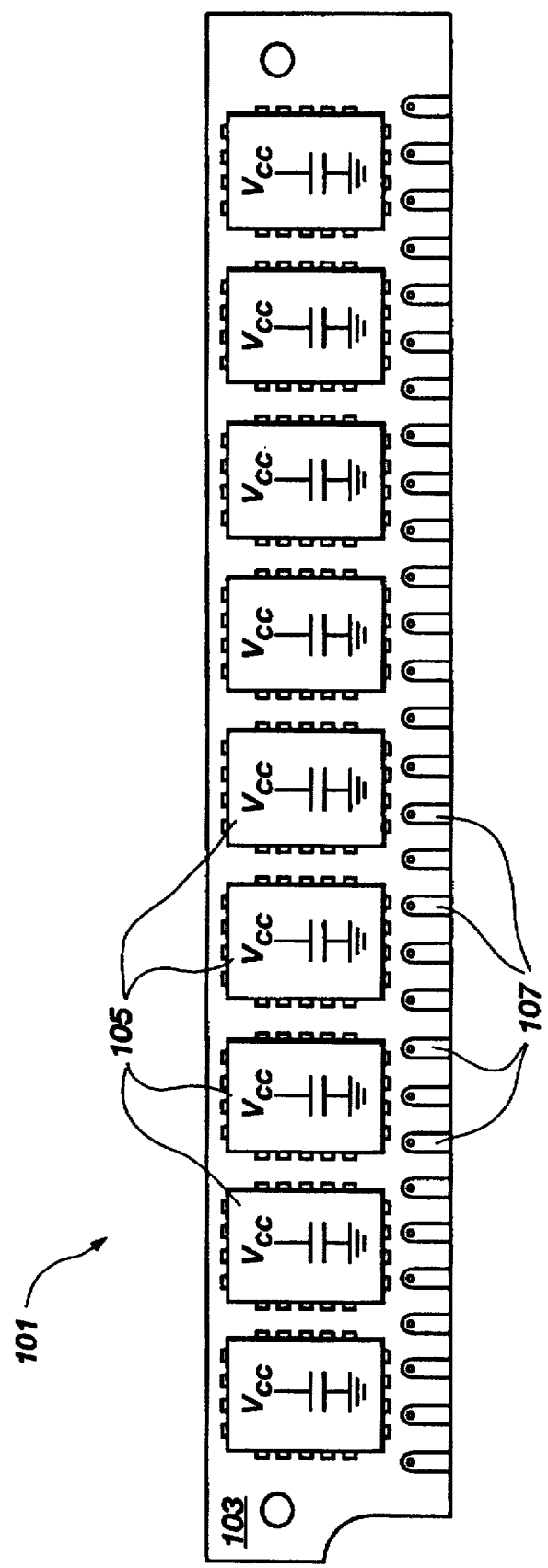
FIG. 10 shows a parallel arrangement of capacitors on a memory array.
Figure 10:
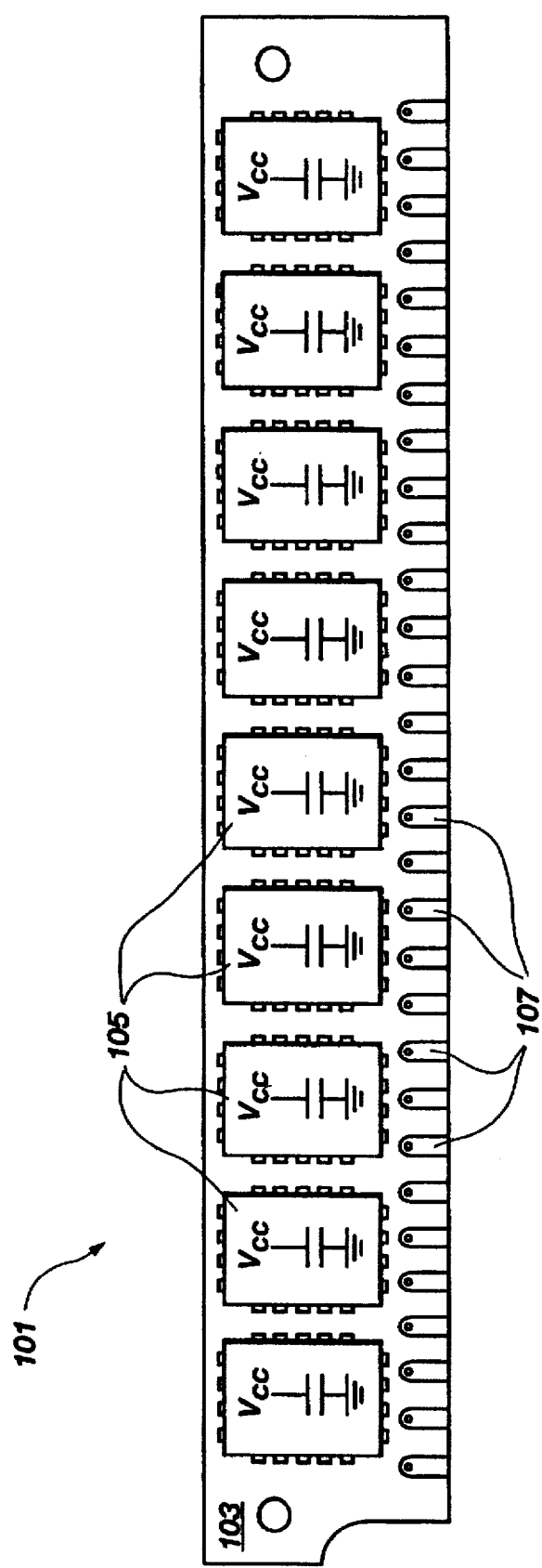
Figure 11:
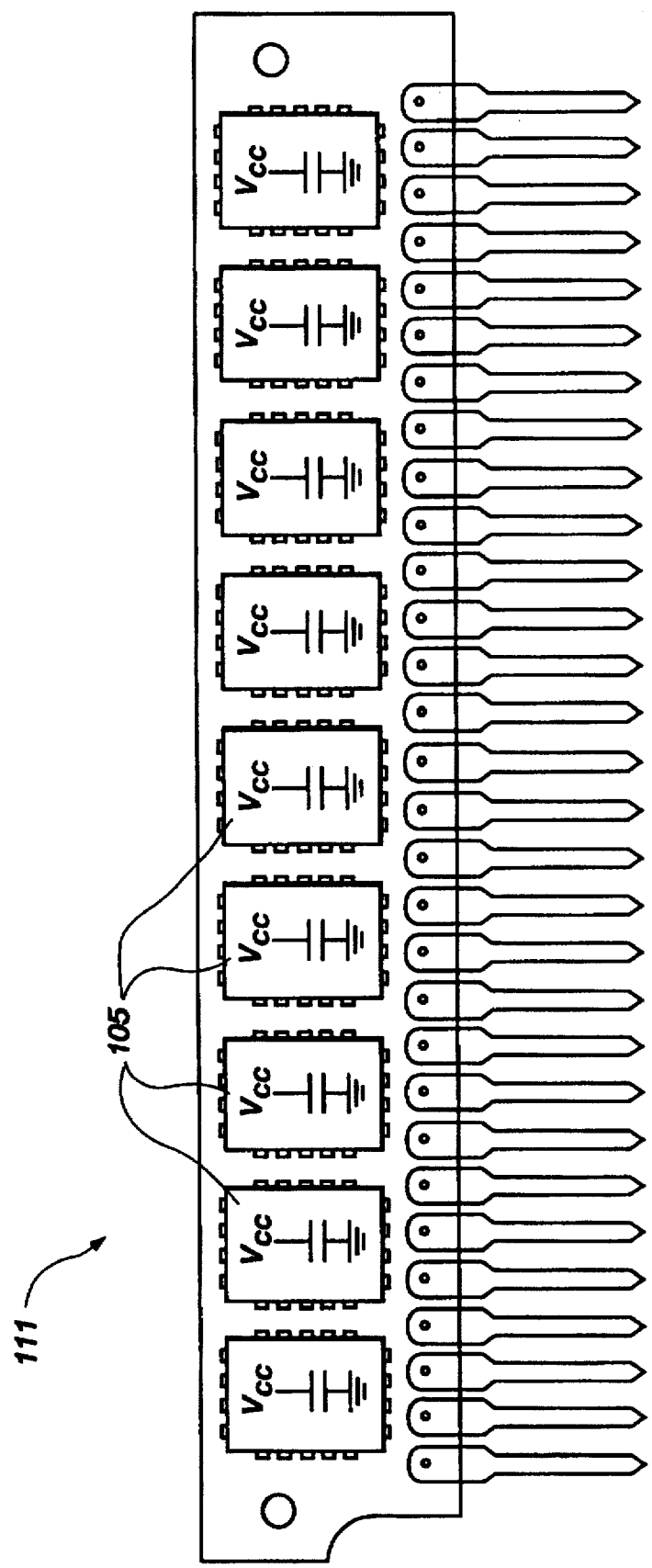
FIG. 11 shows the use of a SIP board.

FIGS. 10 and 11 show the use of capacitors on DRAMs 105. A SIP (single in-line package) board 111 as shown in FIG. 11 and similar boards which use a connector to connect an array of similar components with parallel address circuitry through a connector may also be used with the invention.

By providing a capacitor as a part of the individual DRAMs 105, the SIMM board 101 does not have to be constructed with discrete capacitors mounted to the board. As mentioned, having a capacitor on the die serves to filter the effects of leadwire inductance. Further, since the SIMM board includes byte multiples of DRAMs, the capacitors on board each chip are connected in parallel. While this does not increase the capacitance on the die side of the leadwires, the total capacitance is thereby increased, with the added benefit that some capacitance is on the die side of the leadwire of each chip.

The elimination of discrete capacitors further eliminates a failure mode. It has been found that as many as one in 10,000 discrete capacitors has failed subsequent to burn-in. This had resulted in an added field failure rate of close to one in 1000 for a 8 or 9 device part. Eliminating the discrete capacitors is believed to significantly reduce this failure rate.

There is a possibility that the impedance of the multiple rows of the DRAMs 105 results in a mismatch (of impedance) of multiplexed RAS and CAS signal lines if the signals are intended for use with a single row of DRAMs. In order to cause the impedance to match that of inputs, termination capacitors (not shown) may be used to compensate for the shifted impedance load of the DRAMs caused by the multiple rows of DRAMs 105. The termination capacitors may be discrete elements, even if load capacitors are incorporated onto the DRAMs 105.

Figure 12:
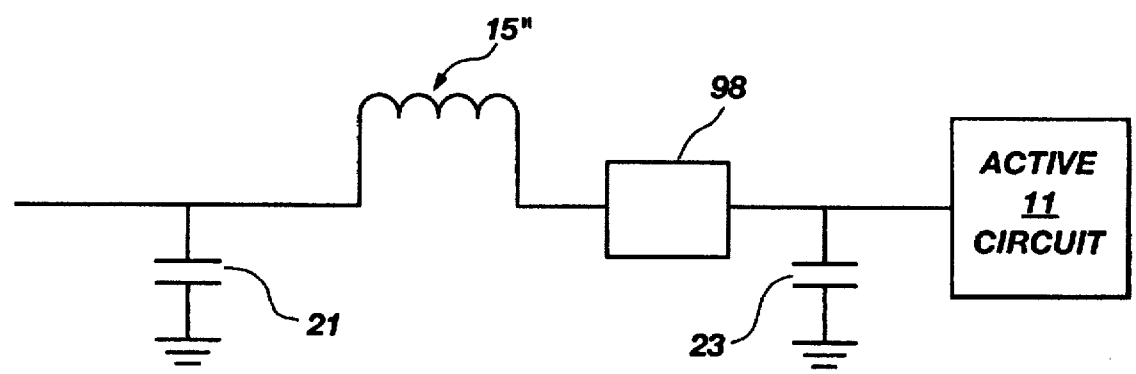
FIG. 12 shows a schematic block diagram representation of semiconductor circuit device having an on-chip regulator.

Referring to FIG. 12, a regulator 96 is on-chip with capacitor 23 and die 11.

What has been described is a specific embodiment of the invention. The invention is expected to be able to work with other memory devices, such as SRAMS and VRAMS. It is anticipated that variations can be made on the preferred embodiment and therefore, the invention should be read as limited only by the claims.

We claim:

1. A semiconductor device system to be electrically connected to external circuitry, the system comprising:
   a support surface having a first set of conductors electrically connected to each other, and a second set of conductors electrically connected to each other; and
   a plurality of semiconductor devices supported by the support surface and each including:
   a first contact electrically connected to one of the first set of conductors;
   a second contact electrically connected to one of the second set of conductors;
   a substrate of a first conductivity type;
   active circuit devices on the substrate; and
   a depletion mode on-chip capacitor including a conductive layer separated from the substrate by a dielectric, the capacitor including spaced apart first and second doped regions that are of a second conductivity type, and wherein the conductive layer is electrically connected to the first contact, and the first and second doped regions are electrically connected to the second contact such that the on-chip capacitor may provide filtering capacitance to the semiconductor device.

2. The system of claim 1, wherein the semiconductor devices are packaged semiconductor devices that include leads extending out of the packaging, and wherein the first and second contacts for each semiconductor device are internal to the packaging, and the first and second contacts are electrically connected to the first and second set of conductors through ones of the leads.

3. The system of claim 1, wherein the on-chip capacitors provide capacitive decoupling of the semiconductor device system with respect to the external circuitry.

4. The system of claim 1, wherein the semiconductor devices further include conductive data lines positioned over the on-chip capacitors.

5. The system of claim 1, wherein the conductive layers are polysilicon layers.

6. The system of claim 1, wherein the semiconductor devices are a first set of semiconductor devices and the system further comprises additional semiconductor devices not connected in parallel with the first set of semiconductor devices.

7. The system of claim 1, wherein the first set of conductors are electrically connected through a bus on which a VCC signal may be provided.

8. The system of claim 1, wherein the second set of conductors are electrically connected through a bus on which a VSS signal may be provided.

9. The system of claim 1, wherein the first contacts conduct a VCC signal.

10. The system of claim 1, wherein the second contacts conduct a VSS signal.

11. The system of claim 1, wherein the first contacts include bonding pads.

12. The system of claim 1, wherein the first contacts include lead fingers.

13. The system of claim 1, wherein the first contacts are electrically connected to one of the first set of conductors through lead fingers.

14. The system of claim 1, wherein the plurality is two semiconductor devices.

15. The system of claim 1, wherein there are more than two semiconductor devices.

16. The system of claim 1, wherein the semiconductor devices are memory devices.

17. The system of claim 1, wherein the semiconductor devices are DRAM memory devices.

18. The system of claim 1, wherein the semiconductor devices are SIMM memory devices.

19. The system of claim 1, wherein the semiconductor devices are SIP memory devices.

20. A semiconductor device system to be electrically connected to external circuitry, the system comprising:
 a support surface having a first set of conductors electrically connected to each other, and a second set of conductors electrically connected to each other; and
 a plurality of semiconductor devices supported by the support surface and each including:
  a first contact electrically connected to one of the first set of conductors;
  a second contact electrically connected to one of the second set of conductors;
  a substrate;
  active circuit devices on the substrate; and
  a depletion mode on-chip capacitor including a conductive layer separated from the substrate by a dielectric, the capacitor including a doped region and a more heavily doped region, and wherein the conductive layer is electrically connected to the first contact and wherein the more heavily doped region is connected to the second contact such that the on-chip capacitor may provide filtering capacitance to the semiconductor device.

21. The system of claim 20, wherein the on-chip capacitors provide capacitive decoupling of the semiconductor device system with respect to the external circuitry.

22. The system of claim 20, wherein the semiconductor devices further include conductive data lines positioned over the on-chip capacitors.

23. The system of claim 20, wherein the first contacts conduct a VCC signal.

24. The system of claim 20, wherein the second contacts conduct a VSS signal.

25. A semiconductor device system to be electrically connected to external circuitry, the system comprising:
 a support surface having a first set of conductors electrically connected to each other, and a second set of conductors electrically connected to each other; and
 a plurality of semiconductor devices supported by the support surface and each including:
  a first contact electrically connected to one of the first set of conductors;
  a second contact electrically connected to one of the second set of conductors;
  a substrate;
  active circuit devices on the substrate; and
  an on-chip capacitor, a portion of which is formed in an active area of the substrate, the on-chip capacitor including a first node electrically connected to the first contact, and a second node electrically connected to the second contact such that the on-chip capacitor may provide filtering capacitance to the semiconductor device, and wherein the on-chip capacitors for the semiconductor devices are in parallel between the first and second sets of conductors.

26. The system of claim 25, wherein the semiconductor devices are packaged semiconductor devices that include leads extending out of the packaging, and wherein the first and second contacts for each semiconductor device are inside the packaging, and the first and second contacts are electrically connected to the first and second set of conductors through some of the leads.

27. The system of claim 25, wherein the on-chip capacitors provide capacitive decoupling of the semiconductor device system with respect to the external circuitry.

28. The system of claim 25, wherein the semiconductor devices further include conductive data lines positioned over the on-chip capacitors.

29. The system of claim 25, wherein each of the on-chip capacitors includes a conductive layer connected to the first node.

30. The system of claim 25, wherein each of the on-chip capacitors are depletion mode capacitors.

31. The system of claim 25, wherein each of the on-chip capacitors are enhancement mode capacitors.

32. The system of claim 25, wherein the first contacts conduct a power signal.

33. The system of claim 25, wherein at least some of the active circuit devices are electrically connected to the first node.

34. A semiconductor device system to be electrically connected to external circuitry, the system comprising:
 a support surface having a first set of conductors electrically connected to each other, and a second set of conductors electrically connected to each other; and
 semiconductor devices supported by the support surface and each including:
  a first contact electrically connected to one of the first set of conductors to receive an electrical power signal therefrom;
  a second contact electrically connected to one of the second set of conductors;
  a regulator circuit electrically connected to the first contact;
  a substrate;
  active circuit devices on the substrate; and
  an on-chip capacitor, a portion of which is formed in an active area of the substrate, the on-chip capacitor including a first node electrically connected to the regulator circuit, and a second node electrically connected to the second contact such that the on-chip capacitor may provide filtering capacitance to the semiconductor device.

35. The system of claim 34, wherein the semiconductor devices provide capacitive decoupling of the semiconductor device with respect to the external circuitry.

36. The system of claim 34, wherein each of the on-chip capacitors includes a conductive layer connected to the first node.

37. The system of claim 34, wherein the semiconductor devices further include conductive data lines positioned over the on-chip capacitors.

38. The system of claim 34, wherein each of the on-chip capacitors are depletion mode capacitors.

39. The system of claim 34, wherein each of the on-chip capacitors are enhancement mode capacitors.

* * * * *

UNITED STATES PATENT AND TRADEMARK OFFICE
CERTIFICATE OF CORRECTION

PATENT NO. : 5,687,109
DATED : November 11, 1997
INVENTOR(S) : Protigal et al.

Page 1 of 3

It is certified that error appears in the above-identified patent and that said Letters Patent is hereby corrected as shown below: In the Drawings:
Delete FIG. 10 (first occurrence) and insert FIG. 9 copied below therefor;

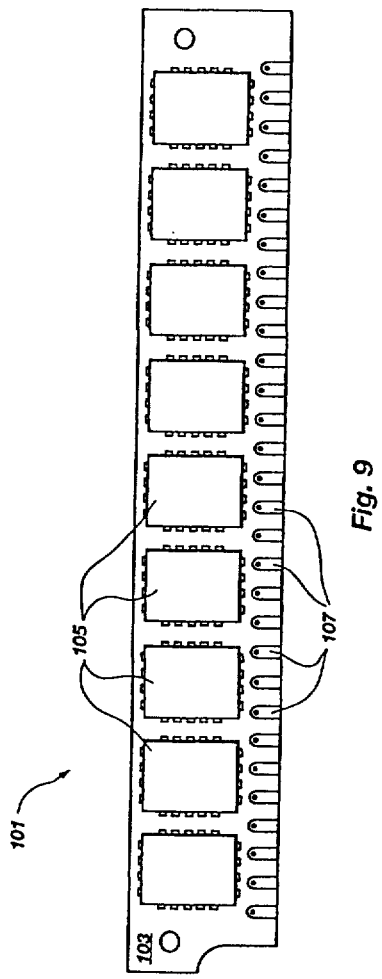

UNITED STATES PATENT AND TRADEMARK OFFICE
CERTIFICATE OF CORRECTION

PATENT NO. : 5,687,109
DATED : November 11, 1997
INVENTOR(S) : Protigal et al.

It is certified that error appears in the above-identified patent and that said Letters Patent is hereby corrected as shown below:

In FIG. 4, change "15" to --30--;

In FIG. 6, change "15" to --30'--;

In FIG. 7, change "15" to --30"--;

In column 1, line 9, change "054,001" to --034,001--;

In column 1, line 10, change "Mar. 14" to --Mar. 19--;

In column 2, line 9, change "in line" to --in-line--;

In column 2, line 51, change "D" to --on the--;

In column 2, line 51, change "via" to --view--;

In column 3, line 35, insert a comma after "is";

In column 4, line 11, delete the hyphen between "a" and "cross" and insert a space therefor;

In column 4, line 15, change the period to a semicolon;

In column 4, line 21, after "of" insert --a--;

In column 4, line 29, insert a comma after "15""; (2nd occurr.)

In column 4, line 36, change the comma after "invention" to a semicolon;

In column 4, line 49, change "uses" to --used--;

In column 4, line 55, insert a comma after "area";

In column 4, line 64, after "would" insert --be--;

UNITED STATES PATENT AND TRADEMARK OFFICE
CERTIFICATE OF CORRECTION

PATENT NO. : 5,687,109
DATED : November 11, 1997
INVENTOR(S) : Protigal et al.

It is certified that error appears in the above-identified patent and that said Letters Patent is hereby corrected as shown below:

In column 5, line 25, change "card" to --board--;

In column 5, line 65, change "96" to --98--;

In column 6, line 36, change "set" to --sets--;

In column 8, line 8, change "set" to --sets--;

In column 8, line 53, after "device" insert --system--;

Signed and Sealed this

Third Day of November, 1998

*Attest:*

*Attesting Officer*

BRUCE LEHMAN

*Commissioner of Patents and Trademarks*